United States Patent
Stephenson et al.

(10) Patent No.: US 9,558,939 B1
(45) Date of Patent: Jan. 31, 2017

(54) METHODS FOR MAKING A SEMICONDUCTOR DEVICE INCLUDING ATOMIC LAYER STRUCTURES USING $N_2O$ AS AN OXYGEN SOURCE

(71) Applicant: ATOMERA INCORPORATED, Los Gatos, CA (US)

(72) Inventors: Robert Stephenson, Duxford (GB); Nyles Cody, Tempe, AZ (US)

(73) Assignee: ATOMERA INCORPORATED, Los Gatos, CA (US)

(*) Notice: Subject to any disclaimer, the term of this patent is extended or adjusted under 35 U.S.C. 154(b) by 0 days.

(21) Appl. No.: 14/996,312

(22) Filed: Jan. 15, 2016

(51) Int. Cl.
*H01L 21/20* (2006.01)
*H01L 21/02* (2006.01)
*H01L 29/778* (2006.01)
*H01L 29/78* (2006.01)

(52) U.S. Cl.
CPC ..... *H01L 21/02507* (2013.01); *H01L 21/0245* (2013.01); *H01L 21/0262* (2013.01); *H01L 29/7786* (2013.01); *H01L 29/7842* (2013.01)

(58) Field of Classification Search
CPC ............ H01L 29/7786; H01L 29/7842; H01L 21/0245; H01L 21/02507; H01L 21/0262
See application file for complete search history.

(56) References Cited

U.S. PATENT DOCUMENTS

| 4,485,128 A | 11/1984 | Dalal et al. |
| 4,590,399 A | 5/1986 | Roxlo et al. |
| 4,594,603 A | 6/1986 | Holonyak, Jr. |
| 4,882,609 A | 11/1989 | Schubert et al. |
| 4,908,678 A | 3/1990 | Yamazaki |
| 4,937,204 A | 6/1990 | Ishibashi et al. |
| 4,969,031 A | 11/1990 | Kobayashi et al. |
| 5,055,887 A | 10/1991 | Yamazaki |
| 5,081,513 A | 1/1992 | Jackson et al. |
| 5,216,262 A | 6/1993 | Tsu |
| 5,357,119 A | 10/1994 | Wang et al. |
| 5,577,061 A | 11/1996 | Hasenberg et al. |

(Continued)

FOREIGN PATENT DOCUMENTS

| EP | 0 843 361 | 5/1998 |
| GB | 2 347 520 | 6/2000 |

(Continued)

OTHER PUBLICATIONS

U.S. Appl. No. 14/948,547; filed Nov. 23, 2015.

(Continued)

*Primary Examiner* — Thanh T Nguyen
(74) *Attorney, Agent, or Firm* — Allen, Dyer, Doppelt, Milbrath & Gilchrist, P.A. Attorneys at Law

(57) ABSTRACT

A method for making a semiconductor device may include forming a plurality of spaced apart structures on a semiconductor substrate within a semiconductor processing chamber, with each structure including a plurality of stacked groups of layers. Each group of layers may include a plurality of stacked base silicon monolayers defining a base semiconductor portion and at least one oxygen monolayer constrained within a crystal lattice of adjacent base silicon portions. Furthermore, the oxygen monolayers may be formed using $N_2O$ as an oxygen source.

25 Claims, 10 Drawing Sheets

(56) References Cited

U.S. PATENT DOCUMENTS

| | | |
|---|---|---|
| 5,594,567 A | 1/1997 | Akiyama et al. |
| 5,606,177 A | 2/1997 | Wallace et al. |
| 5,616,515 A | 4/1997 | Okuno |
| 5,627,386 A | 5/1997 | Harvey et al. |
| 5,683,934 A | 11/1997 | Candelaria |
| 5,684,817 A | 11/1997 | Houdre et al. |
| 5,994,164 A | 11/1999 | Fonash et al. |
| 6,058,127 A | 5/2000 | Joannopoulos et al. |
| 6,255,150 B1 | 7/2001 | Wilk et al. |
| 6,274,007 B1 | 8/2001 | Smirnov et al. |
| 6,281,518 B1 | 8/2001 | Sato |
| 6,281,532 B1 | 8/2001 | Doyle et al. |
| 6,326,311 B1 | 12/2001 | Ueda et al. |
| 6,344,271 B1 | 2/2002 | Yadav et al. |
| 6,350,993 B1 | 2/2002 | Chu et al. |
| 6,376,337 B1 | 4/2002 | Wang et al. |
| 6,436,784 B1 | 8/2002 | Allam |
| 6,472,685 B2 | 10/2002 | Takagi |
| 6,498,359 B2 | 12/2002 | Schmidt et al. |
| 6,501,092 B1 | 12/2002 | Nikonov et al. |
| 6,521,549 B1 | 2/2003 | Kamath et al. |
| 6,566,679 B2 | 5/2003 | Nikonov et al. |
| 6,608,327 B1 | 8/2003 | Davis et al. |
| 6,621,097 B2 | 9/2003 | Nikonov et al. |
| 6,638,838 B1 | 10/2003 | Eisenbeiser et al. |
| 6,646,293 B2 | 11/2003 | Emrick et al. |
| 6,673,646 B2 | 1/2004 | Droopad |
| 6,690,699 B2 | 2/2004 | Capasso et al. |
| 6,711,191 B1 | 3/2004 | Kozaki et al. |
| 6,741,624 B2 | 5/2004 | Mears et al. |
| 6,748,002 B2 | 6/2004 | Shveykin |
| 6,816,530 B2 | 11/2004 | Capasso et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,109,052 B2 | 9/2006 | Mears et al. |
| 7,123,792 B1 | 10/2006 | Mears et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,497,171 B1 | 7/2013 | Wu et al. |
| 2002/0094003 A1 | 7/2002 | Bour et al. |
| 2003/0034529 A1 | 2/2003 | Fitzgerald et al. |
| 2003/0057416 A1 | 3/2003 | Currie et al. |
| 2003/0089899 A1 | 5/2003 | Lieber et al. |
| 2003/0162335 A1 | 8/2003 | Yuki et al. |
| 2003/0215990 A1 | 11/2003 | Fitzgerald et al. |
| 2004/0084781 A1 | 5/2004 | Ahn et al. |
| 2004/0227165 A1 | 11/2004 | Wang et al. |
| 2004/0262594 A1 | 12/2004 | Mears et al. |
| 2004/0262597 A1 | 12/2004 | Mears et al. |
| 2004/0266045 A1 | 12/2004 | Mears et al. |
| 2004/0266046 A1 | 12/2004 | Mears et al. |
| 2004/0266116 A1 | 12/2004 | Mears et al. |
| 2005/0029510 A1 | 2/2005 | Mears et al. |
| 2005/0032247 A1 | 2/2005 | Mears et al. |
| 2005/0163692 A1 | 7/2005 | Atanackovic |
| 2005/0208715 A1 | 9/2005 | Seo et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0226502 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard et al. |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Halilov et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2008/0197340 A1 | 8/2008 | Mears et al. |
| 2008/0315295 A1* | 12/2008 | Ji ............................ C23C 16/04 257/325 |
| 2009/0072276 A1 | 3/2009 | Inaba |
| 2009/0267155 A1 | 10/2009 | Izumida et al. |
| 2010/0270535 A1 | 10/2010 | Halilov et al. |
| 2011/0215299 A1 | 9/2011 | Rao |
| 2011/0275163 A1* | 11/2011 | Ahn ..................... C23C 16/409 438/3 |
| 2012/0261716 A1 | 10/2012 | Yanagihara |
| 2013/0026486 A1 | 1/2013 | Miyoshi et al. |
| 2013/0240836 A1 | 9/2013 | Lee et al. |
| 2015/0144877 A1 | 5/2015 | Mears et al. |
| 2015/0144878 A1 | 5/2015 | Mears et al. |
| 2015/0357414 A1 | 12/2015 | Mears et al. |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 96/29728 | 9/1996 |
| WO | 99/63580 | 12/1999 |
| WO | 02/103767 | 12/2002 |
| WO | 2005034245 | 4/2005 |
| WO | 2007011790 | 1/2007 |
| WO | 2008130899 | 10/2008 |

(56) References Cited

FOREIGN PATENT DOCUMENTS

OTHER PUBLICATIONS

Luo et al., "Chemical Design of Direct-Gap Light-Emitting Silicon", published in Physical Review Letters, vol. 89, No. 7 (Aug. 12, 2002) 4 pgs.

Raphael Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.

Yu et al., GaAs MOSFET with Oxide Gate Dielectric Grown by Atomic Layer Deposition, Agere Systems, Mar. 2003; 7 pgs.

Novikov et al., Silicon-based Optoelectronics, 1999-2003, pp. 1-6.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs.

Shah et al., Experimental Analysis and Theoretical Model for Anomalously High Ideality Factors (n>2.0) in AIGaN/ GaN P-N. Junction Diodes, Journal of Applied Physics, vol. 94, No. 4, Aug. 15, 2003; 4 pgs.

Ball, Striped Nanowires Shrink Electronics, news@nature.com, Feb. 7, 2002; 2 pgs.

Fiory et al., Light Emission from Silicon; Some Perspectives and Applications, Journal of Electronic Materials, vol. 32, No. 10, 2003; pp. 1043-1051.

Lecture 6: Light Emitting and Detecting Devices, MSE 6001, Semiconductor Materials Lectures, Fall 2004; 4 pgs.

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs.

Bu, "FINFET Technology, a substrate prospective", IBM Research, PreTO Alliance, SOI Conference, 2011, pp. 1-28.

Xu et al., "MOSFET performance and scalability enhancement by insertion of oxygen layers", Department of Electrical Engineering and Computer Science, University of California, Berkeley, 2012, pp. 1-4.

R. Tsu "Phenomena in silicon nanostructure devices" published online Sep. 6, 2000 by Applied Physics and Materials Science & Processing, pp. 391-402.

Shinada et al., Nature 437, 1128 (2005)) Retrieved from Internet Jun. 19, 2015; 3 pgs.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; eptember 2014. pp. 3345-3349.

\* cited by examiner

METHODS FOR MAKING A SEMICONDUCTOR DEVICE INCLUDING ATOMIC LAYER STRUCTURES USING $N_2O$ AS AN OXYGEN SOURCE

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

A method for making a semiconductor device may include forming a plurality of spaced apart structures on a semiconductor substrate within a semiconductor processing chamber, with each structure including a plurality of stacked groups of layers. Each group of layers may include a plurality of stacked base silicon monolayers defining a base semiconductor portion and at least one oxygen monolayer constrained within a crystal lattice of adjacent base silicon portions. Furthermore, the oxygen monolayers may be formed using $N_2O$ as an oxygen source.

More particularly, the plurality of spaced apart structures may be formed using epitaxial chemical vapor deposition (CVD). By way of example, the base silicon monolayers may be formed at a temperature in a range of 600° C. to 800° C., and more particularly at a temperature in a range of 665° C. to 685° C.

Also by way of example, the oxygen monolayers may be formed at a temperature in a range of 500° C. to 750° C. An exposure time for the oxygen source may be between 1 and 240 seconds, and more particularly between 12 and 24 seconds, for example, and the oxygen source may comprise a helium source gas with less than 2% $N_2O$.

The method may further include forming shallow trench isolation (STI) regions between the spaced apart structures. More particularly, the STI regions may be formed prior to forming the spaced apart structures. In addition, a respective cap semiconductor layer may be formed on each of the spaced apart structures. Furthermore, forming the cap semiconductor layers may comprise forming the cap semiconductor layers at a temperature in a range of 580° C. to 900° C.

DETAILED DESCRIPTION OF THE EMBODIMENTS

Figure 1:
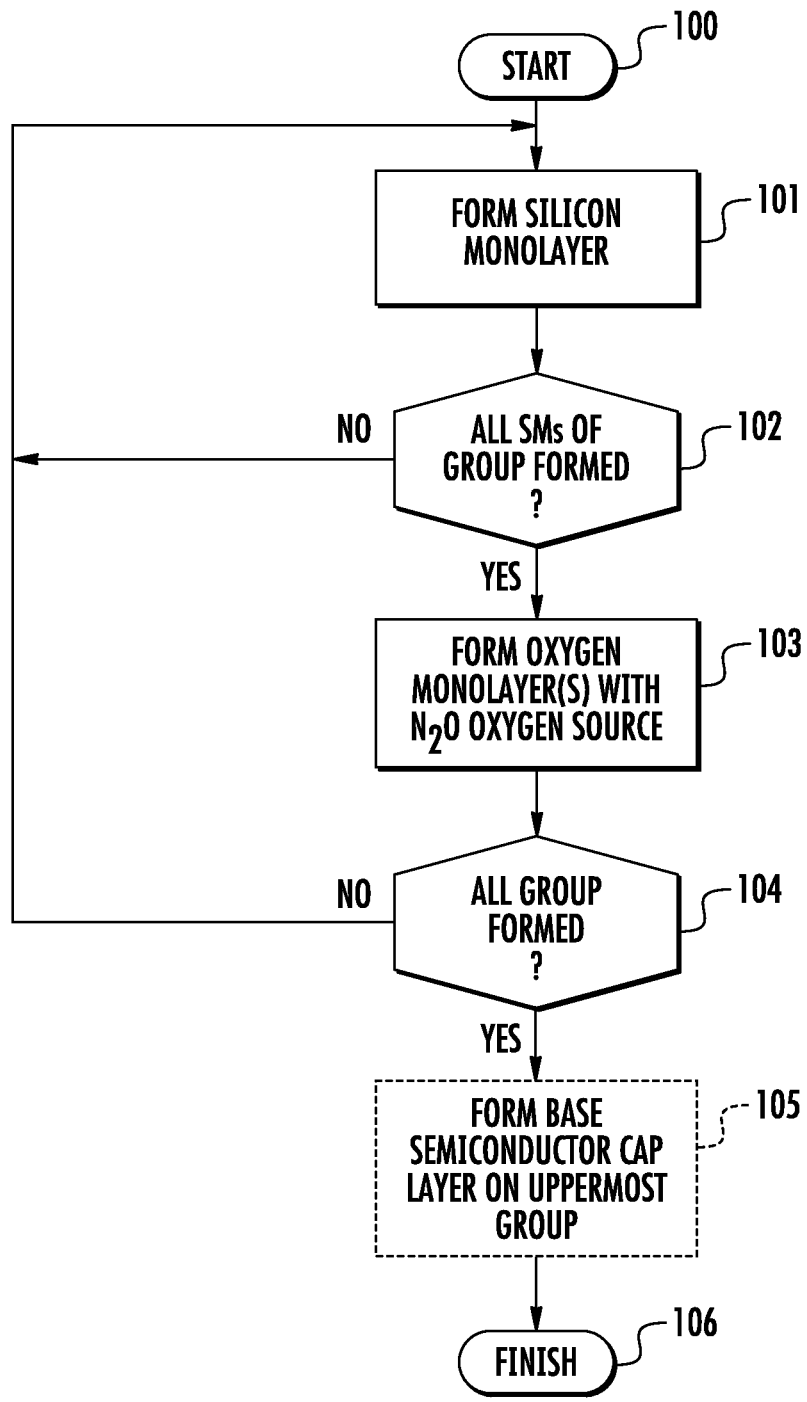
FIG. 1 is a flow diagram illustrating a method for making a semiconductor device including a superlattice in accordance with the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The embodiments relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) =$$

$$\frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, EF is the Fermi energy, T is the temperature, E(k,n) is the energy of an electron in the state corresponding to wave vector k and the nth energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

The higher charge carrier mobility may result from a lower conductivity effective mass for the charge carriers in the parallel direction than would otherwise be present. The conductivity effective mass may be less than two-thirds the conductivity effective mass that would otherwise occur. Of course, the superlattice may further comprise at least one type of conductivity dopant therein.

Using the above-described measures, one can select materials having improved band structures for specific purposes. One such example would be a superlattice 25 material for a channel region in a semiconductor device. A semiconductor device 20 including the superlattice 25 in accordance with the invention is now first described with reference to FIG. 2. One skilled in the art, however, will appreciate that the materials identified herein could be used in many different types of semiconductor devices, such as discrete devices and/or integrated circuits. The device 20 illustratively includes a substrate 21 and a plurality of shallow trench isolation (STI) regions between adjacent superlattices 25. Further processing may then be performed on the device 20 to create various semiconductor structures, such as those described in U.S. Pat. Nos. 6,897,472; 6,993,222; 7,202,494; 7,432,524; 7,586,165; 7,612,366; 7,659,539; 7,781,827; and 7,863,066, for example, which are also assigned to the present Assignee and are hereby incorporated herein in their entireties by reference.

Applicants have identified improved materials or structures and methods for making the superlattice 25. More specifically, the Applicants have identified materials or structures having energy band structures for which the appropriate conductivity effective masses for electrons and/or holes are substantially less than the corresponding values for silicon.

Figure 2:
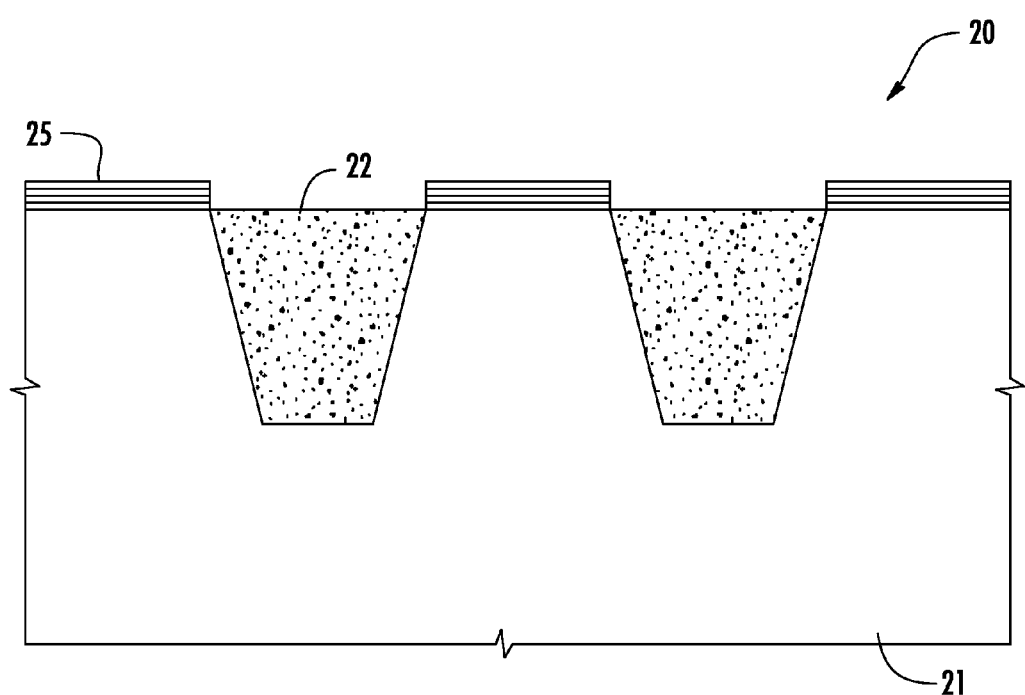
FIG. 2 is a schematic cross-sectional view of a semiconductor device formed in accordance with the present invention including a plurality of selectively formed superlattices.
Figure 3:
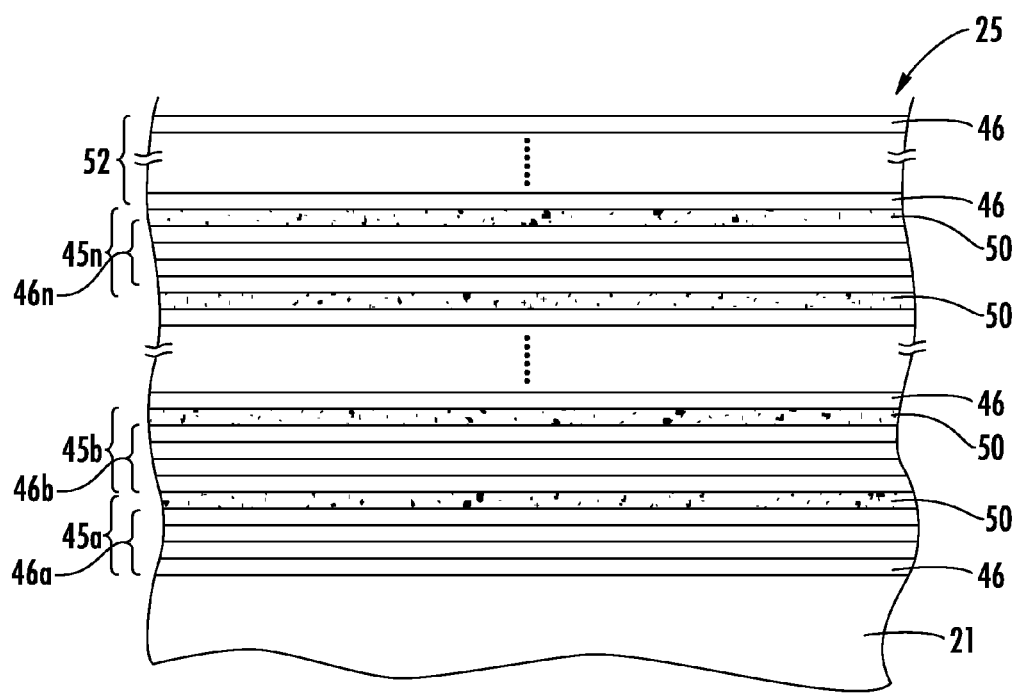
FIG. 3 is a greatly enlarged schematic cross-sectional view of the superlattice as shown in FIG. 2.

Referring now additionally to FIGS. 2 and 3, the structure of the superlattice 25 is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 3.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 3 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top monolayer of the group 45a will be covalently bonded with silicon atoms in the lower or bottom monolayer of the group 45b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices.

As will be appreciated by those skilled in the art, the source/drain regions 22/26, 23/27 and gate 35 of the MOSFET 20 may be considered as regions for causing the transport of charge carriers through the superlattice 25 in a parallel direction relative to the layers of the stacked groups 45a-45n. Other such regions are also contemplated by the present invention.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. However, eight or more layers may be used in other embodiments, depending upon the given application. The 4/1 repeating structure shown in FIGS. 3 and 4, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art.

Figure 5:
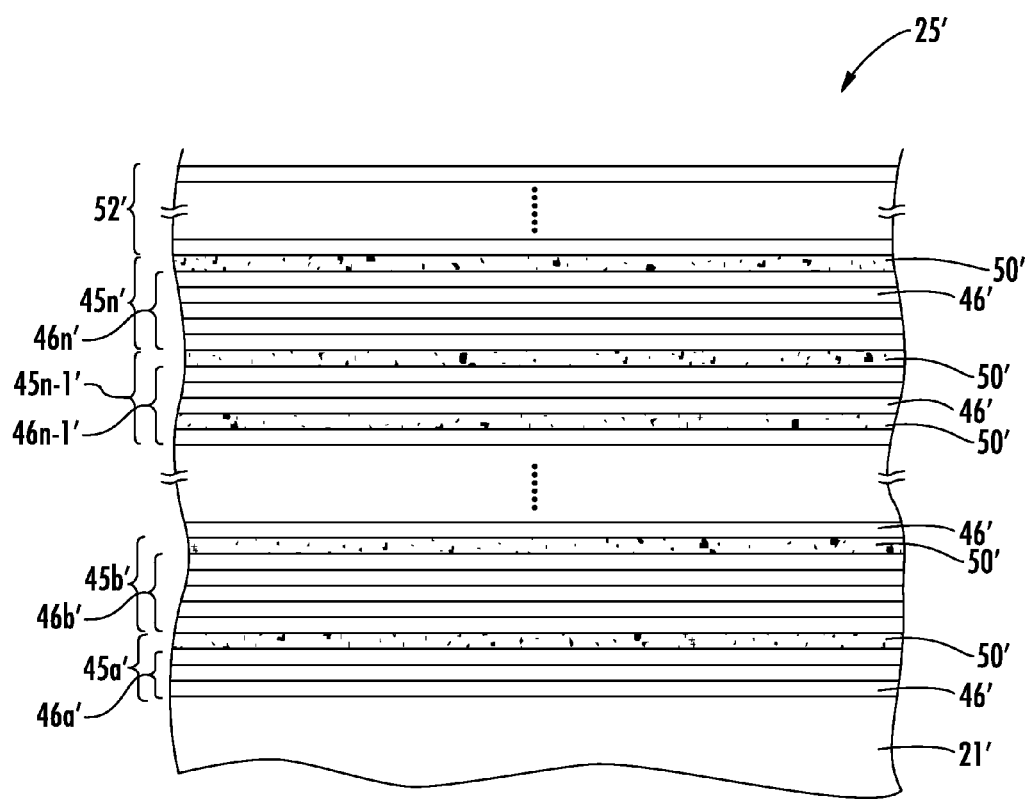
FIG. 5 is a greatly enlarged schematic cross-sectional view of another embodiment of a superlattice that may be used in the device of FIG. 2.

Indeed, referring now additionally to FIG. 5, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 5 not specifically mentioned are similar to those discussed above with reference to FIG. 3 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 6A:
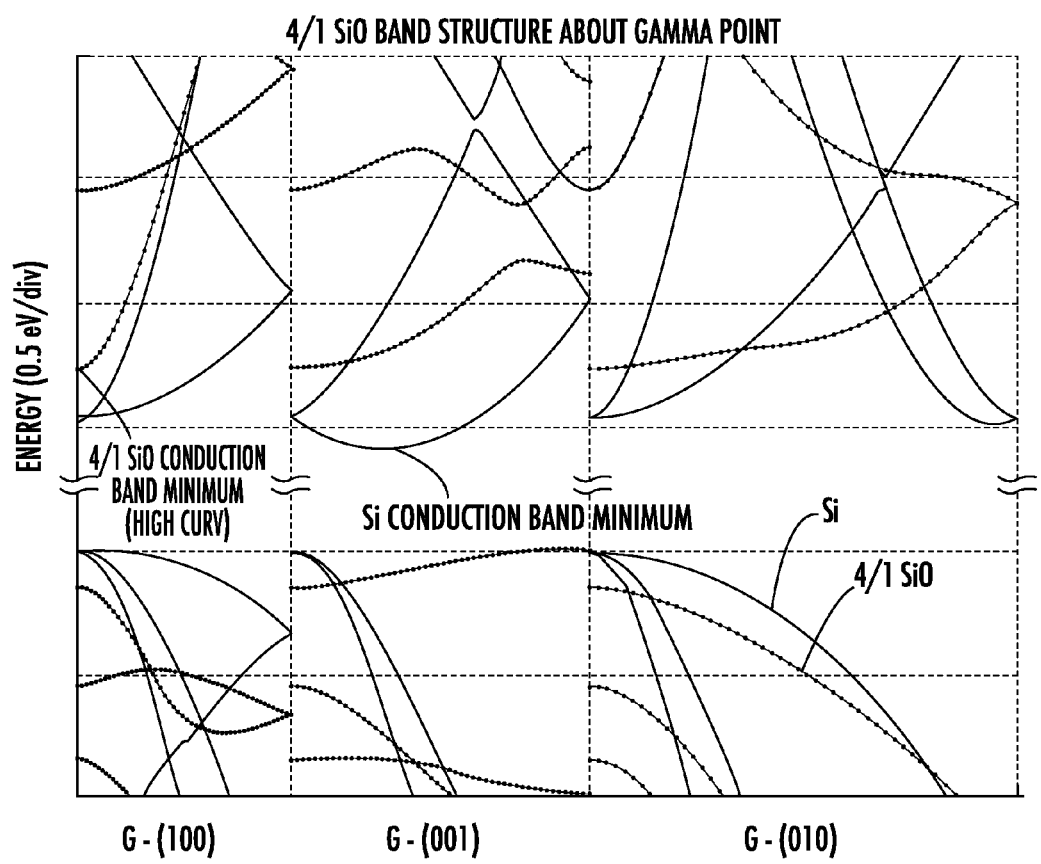
FIG. 6A is a graph of the calculated band structure from the gamma point (G) for both bulk silicon as in the prior art, and for the 4/1 Si/O superlattice as shown in FIGS. 2-4.
Figure 6B:
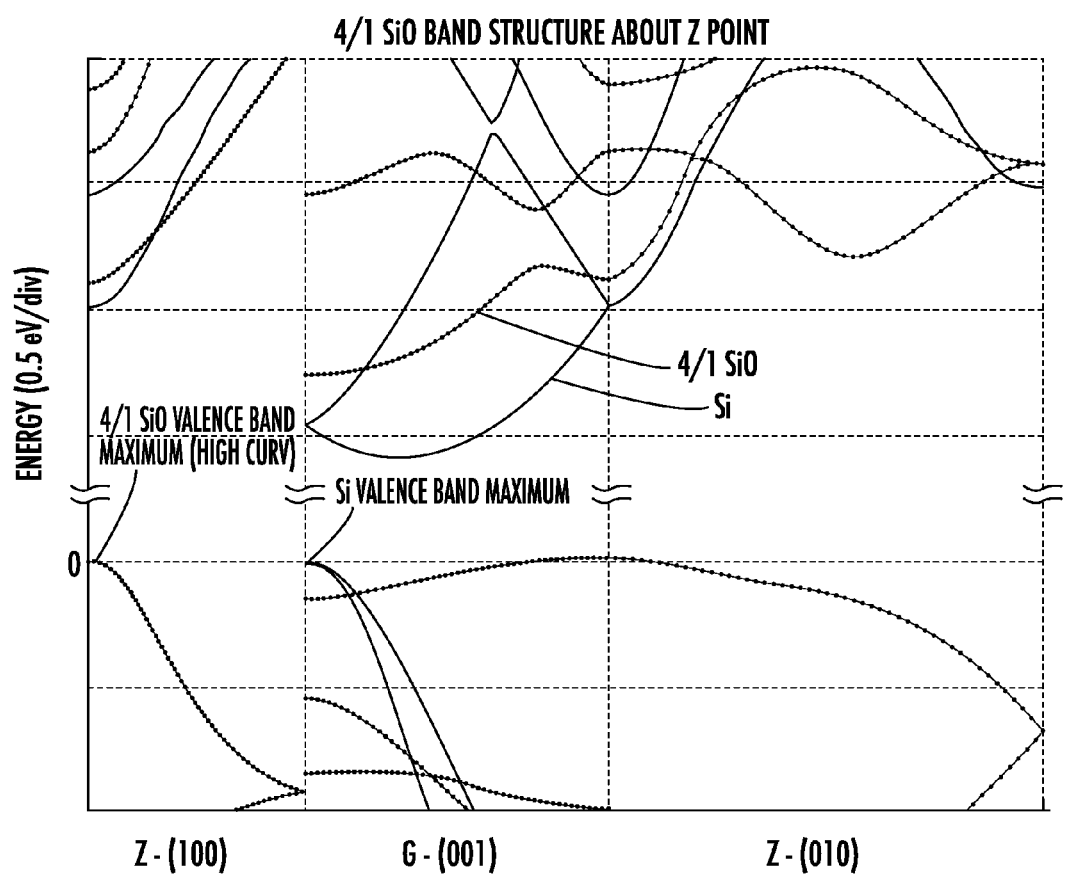
FIG. 6B is a graph of the calculated band structure from the Z point for both bulk silicon as in the prior art, and for the 4/1 Si/O superlattice as shown in FIGS. 2-4.
Figure 6C:
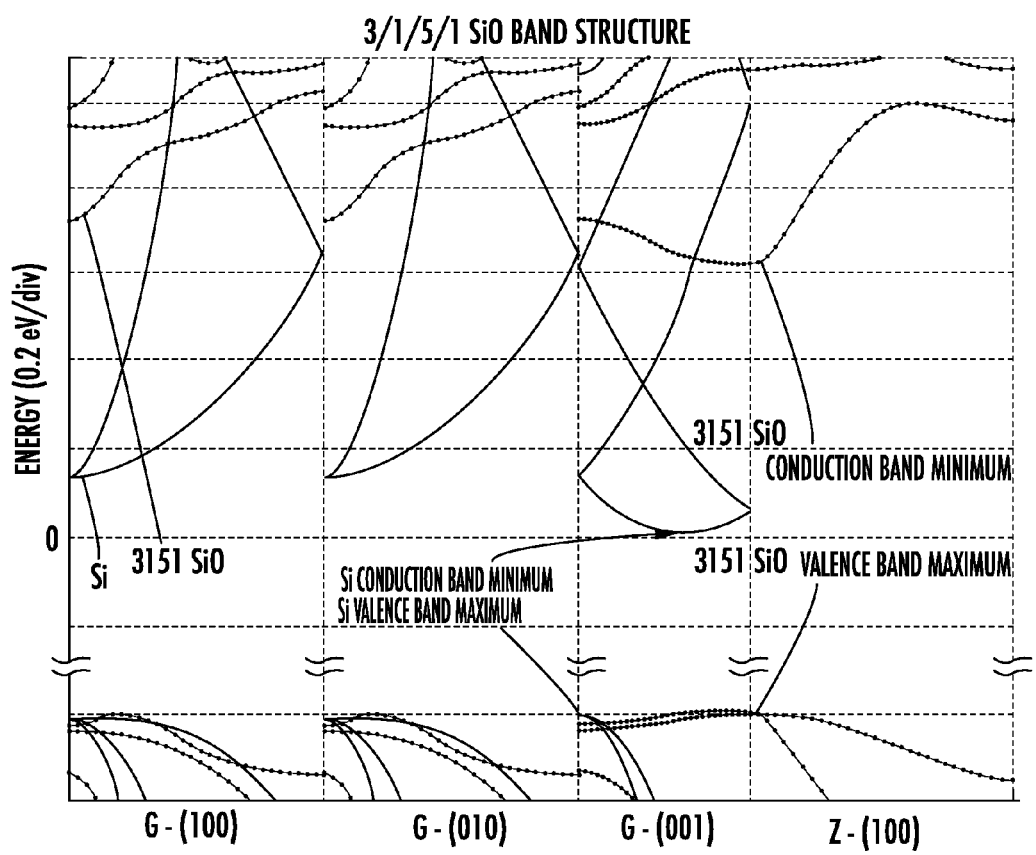
FIG. 6C is a graph of the calculated band structure from both the gamma and Z points for both bulk silicon as in the prior art, and for the 5/1/3/1 Si/O superlattice as shown in FIG. 5.

In FIGS. 6A-6C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

Figure 4:
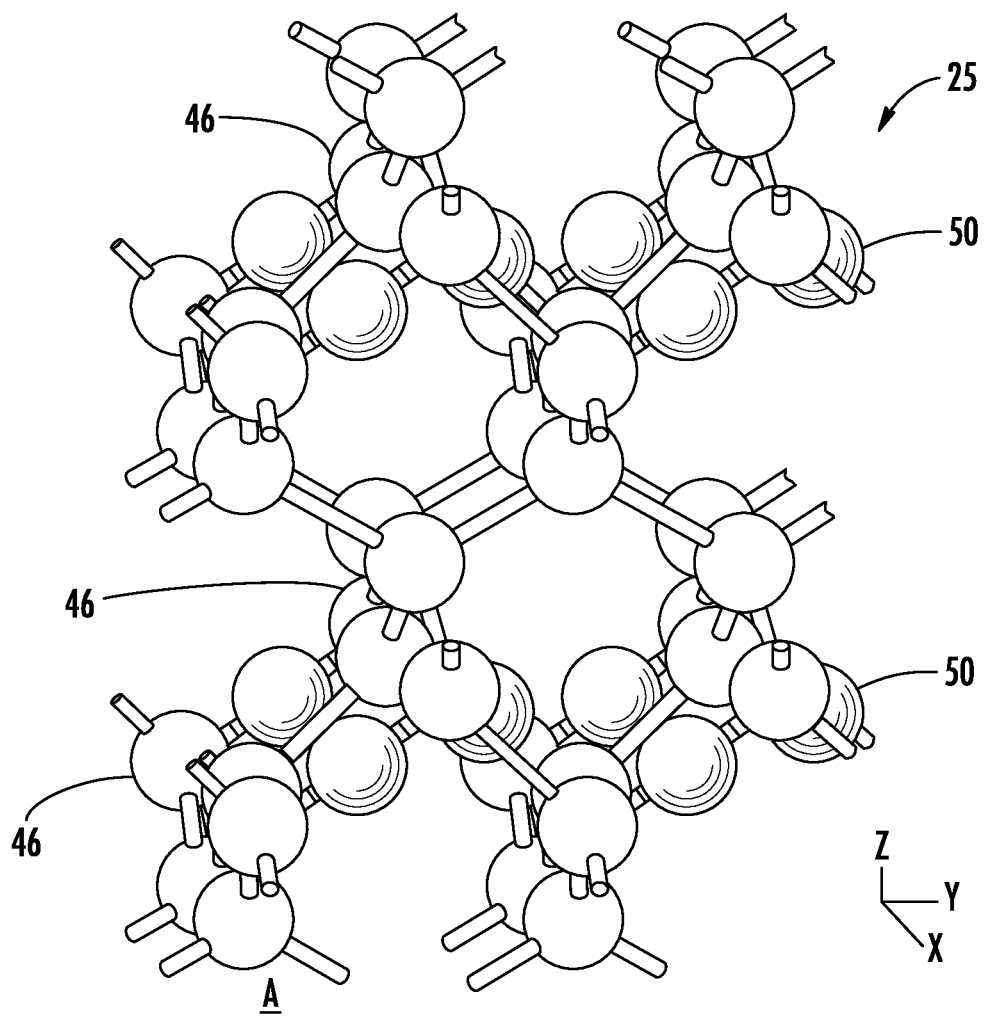
FIG. 4 is a perspective schematic atomic diagram of a portion of the superlattice shown in FIG. 2.

FIG. 6A shows the calculated band structure from the gamma point (G) for both bulk silicon (represented by continuous lines) and for the 4/1 Si/O superlattice 25 as shown in FIGS. 3-4 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 6B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 6C shows the calculated band structure from the both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now additionally to FIG. 1, a method for making the semiconductor device 20 including the superlattice 25 will now be described. The superlattices 25 may be selectively formed on the silicon substrate 21. By way of example, the substrate 21 may be an eight-inch wafer of lightly doped P-type or N-type single crystal silicon with <100> orientation, although other suitable substrates may also be used.

The superlattice 25 material is selectively formed at desired locations across the upper surface of the substrate 21 (although a non-selective process may be used in certain embodiments). For example, the STI region 22 may be formed at spaced apart locations on the substrate 21 to define the desired locations where the superlattice 25 material is to be deposited.

Beginning at Block 100, one or more base semiconductor (here silicon) monolayers 46 are formed on the substrate 21 in the selected locations by successive atomic layer deposition in a processing chamber, at Block 101. Deposition may be performed with a single wafer in the chamber, or multiple wafers may be simultaneously processed in the same chamber in certain embodiments. Silane, disilane, trisilane, or other suitable deposition agents may be used at a temperature in a range of about 425° C. to 625° C. and at a pressure in a range of about 20 to 80 Torr, for example. Nitrogen or hydrogen may be used as a delivery agent with about a 20 to 40 SLM, for example.

When all of the silicon monolayers 46 in a particular group have been formed, at Block 102, then the respective oxygen monolayer(s) may be formed, at Block, 103, so that the oxygen monolayer(s) is constrained within a crystal lattice of adjacent base silicon portions, as noted above. Moreover, once all of the groups of the superlattice 25 are formed, a semiconductor (e.g., silicon) cap layer 52 may optionally be formed thereon (Block 105), as discussed further above, which illustratively concludes the method of FIG. 1 (Block 106). By way of example, the cap semiconductor layer 52 may be formed at a temperature in a range of 580° C. to 900° C., and more particularly in a range of 685° C. to 800° C.

Figure 7:
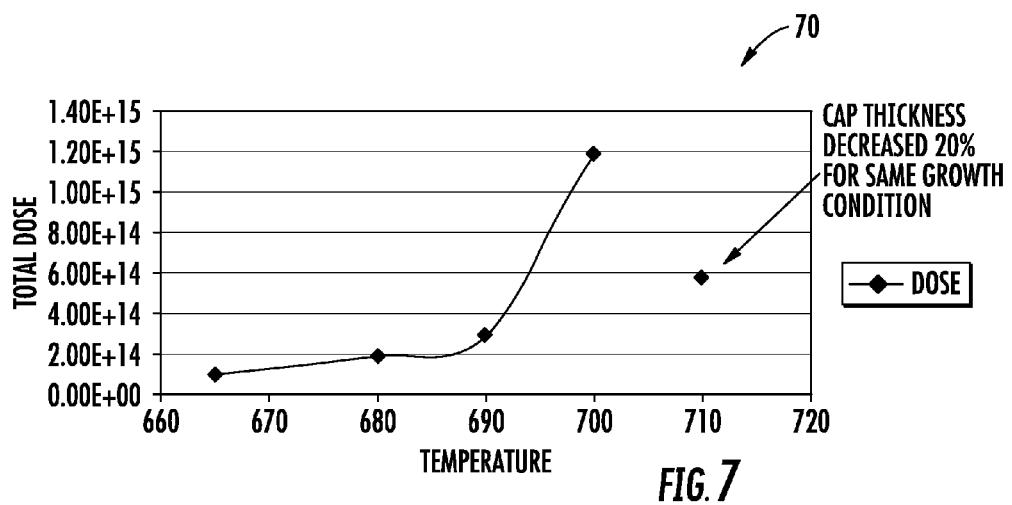
FIG. 7 is a graph of dose vs. temperature for an example implementation of the method of FIG. 1 for making a superlattice structure using an $N_2O$ oxygen source.
Figure 8:
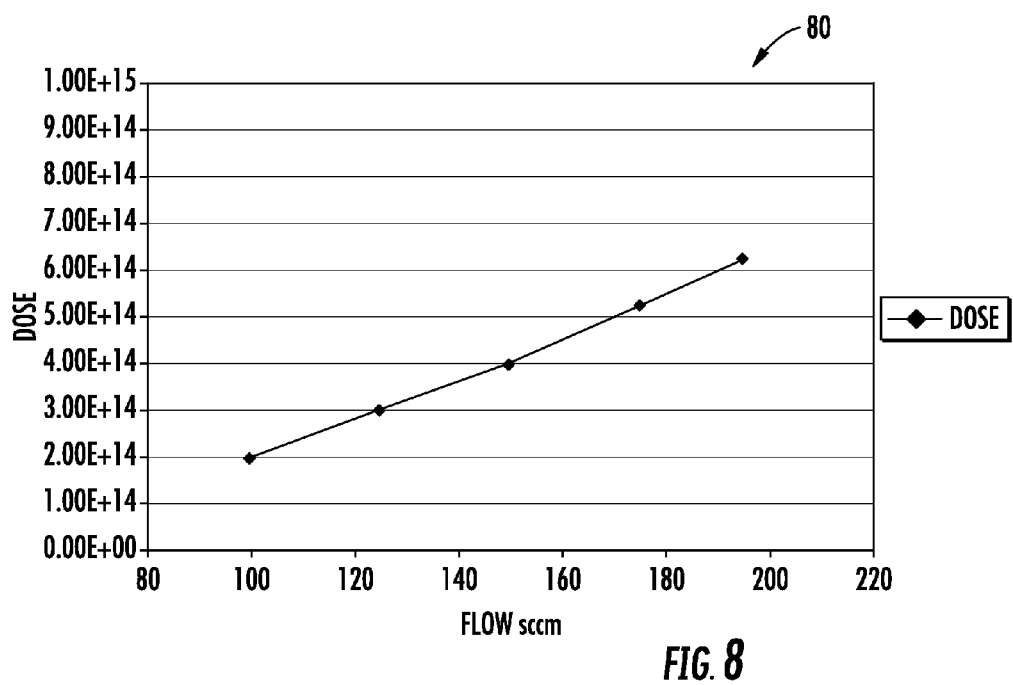
FIG. 8 is a graph of dose vs. flow rate for the example implementation of the method of FIG. 1 for making a superlattice structure using the $N_2O$ oxygen source.
Figure 9:
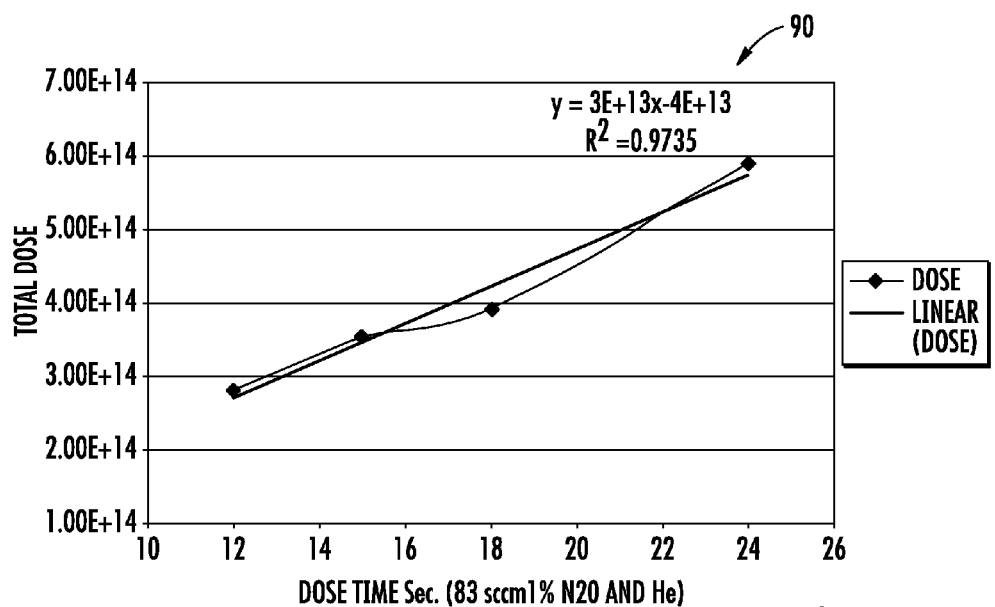
FIG. 9 is a graph of dose vs. time for the example implementation of the method of FIG. 1 for making a superlattice structure using the $N_2O$ oxygen source.

In the illustrated example, the oxygen monolayers are formed using $N_2O$ as an oxygen source. By way of example, the oxygen source may comprise a He source gas with less than 2% $N_2O$, and more particularly, about 1% $N_2O$, although other inert gas sources besides He may also be used in different embodiments. The oxygen monolayers may be formed at a temperature in a range of 500° C. to 750° C., and more particularly in a range from 650° C. to 700° C. Generally speaking, little to no oxygen is incorporated as temperatures drop below 650° C., and above 700° C. the oxygen is incorporated but silicon growth post oxygen deposition may be reduced, e.g., because a different state of incorporation may begin to dominate. These results are illustrated in the graph 70 of FIG. 7, which is for a single wafer processing chamber, where it may be seen that total dose vs. temperature becomes unrepeatable near 650° C. in the example implementation (no $N_2O$ decomposition), and become unstable above 700° C. (i.e., where there is a change in oxygen bonding to silicon). In the same single wafer processing implementation, example oxygen source flows may range from 80 to 195 sccm with dose times in a range of 1 to 240 seconds, and more particularly in a range of 12 to 24 seconds, for example, as seen in the graphs 80 and 90 and of FIGS. 8 and 9, respectively. In the graph 90, it may be seen that the total dose vs. time (for 650° C. and 83 sccm) is linear. On this illustrated scale, oxygen would be at 1E15 at/$cm^2$ for an exposure down at 3 seconds.

Figure 10:
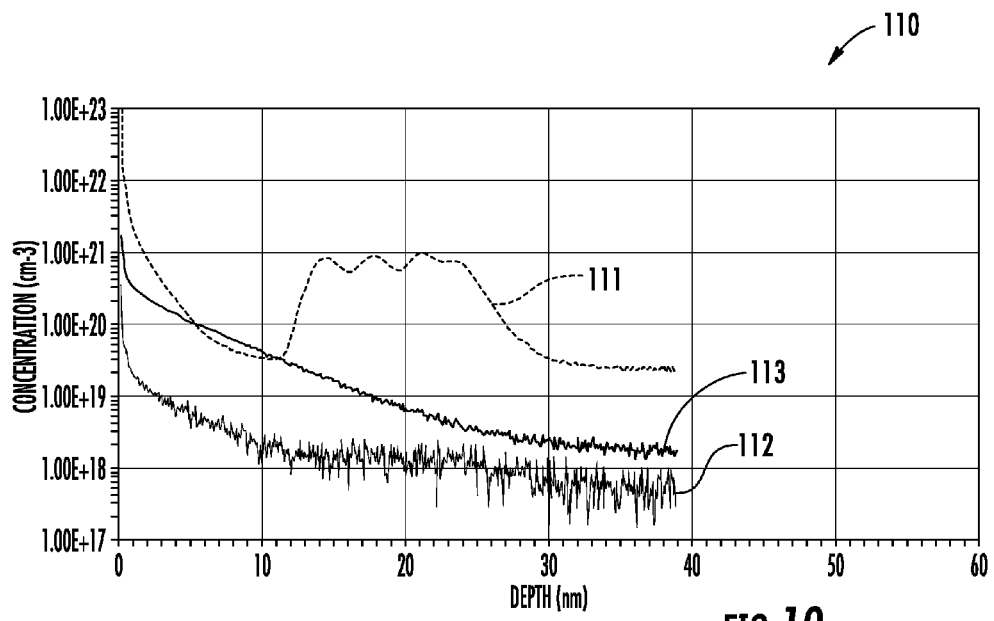
FIG. 10 is a graph of material concentration vs. depth for the example implementation of the method of FIG. 1 for making a superlattice structure using the $N_2O$ oxygen source.

Referring additionally to FIG. 10, a graph 110 illustrates material concentrations vs. depth for an example fabrication of a silicon/oxygen superlattice 25 in a single wafer chamber in which the oxygen source was approximately 1% $N_2O$ in a He gas flow for a duration of 12 seconds, with a flow rate of 170 sccm at a temperature of 680° C. The oxygen concentration is represented by the plot line 111, SiN is represented by the plot line 112, and C12 is represented by the plot line 113.

Generally speaking, the above described process using $N_2O$ as the oxygen source may be particularly helpful for multi-wafer processing to provide better uniformity, as $N_2O$ is less reactive than $O_2$. In particular, the oxygen incorporation rate by $N_2O$ has been found to be roughly 10× lower than by $O_2$. With respect to multi-wafer processing, the lower reactivity means that temperature may be increased somewhat (keeping within the range necessary for oxygen incorporation control), and with longer exposure times, which helps with uniformity. Moreover, as a result of the less reactive nature of $N_2O$, the $N_2O$ gas phase reaction with respect to $H_2$ may be reduced in certain multi-wafer chambers, leading to better gas delivery to the wafers and improved film uniformity. Furthermore, with the higher temperatures, purge times may be reduced and throughput may be increased.

On the other hand, the processing parameters should be selected as discussed above so that the process is still reactive enough to provide desired oxygen coverage. More specifically, while temperature may be increased to get an oxygen source to react, in the case of the superlattice 25, if the temperature is too high, the oxygen may either desorb before the next silicon monolayer is put down, or the oxygen may bond in a different configuration (e.g., $SiO_2$), which would prevent the restart of silicon epitaxial growth all together.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming a plurality of spaced apart structures on a semiconductor substrate within a semiconductor processing chamber, each structure comprising a plurality of stacked groups of layers, and each group of layers comprising a plurality of stacked base silicon monolayers defining a base semiconductor portion and at least one oxygen monolayer constrained within a crystal lattice of adjacent base silicon portions;
   wherein the oxygen monolayers are formed using $N_2O$ as an oxygen source.

2. The method of claim 1 wherein forming comprises forming the plurality of groups of spaced apart structures using epitaxial chemical vapor deposition (CVD).

3. The method of claim 1 wherein the base silicon monolayers are formed at a temperature in a range of 600° C. to 800° C.

4. The method of claim 3 wherein the base silicon monolayers are formed at a temperature in a range of 665° C. to 685° C.

5. The method of claim 1 wherein the oxygen monolayers are formed at a temperature in a range of 500° C. to 750° C.

6. The method of claim 1 wherein an exposure time for the oxygen source is between 1 and 240 seconds.

7. The method of claim 1 wherein the oxygen source comprises a helium source gas with less than 2% $N_2O$.

8. The method of claim 1 further comprising forming shallow trench isolation (STI) regions between the spaced apart structures.

9. The method of claim 8 wherein the STI regions are formed prior to forming the spaced apart structures.

10. The method of claim 1 further comprising forming a respective cap semiconductor layer on each of the spaced apart structures.

11. The method of claim 10 wherein forming the cap semiconductor layers comprises forming the cap semiconductor layers at a temperature in a range of 580° C. to 900° C.

12. A method for making a semiconductor device comprising:
    forming a plurality of spaced apart structures on a semiconductor substrate with shallow trench isolation (STI) regions between adjacent structures within a semiconductor processing chamber using epitaxial chemical vapor deposition (CVD), each structure comprising a plurality of stacked groups of layers, and each group of layers comprising a plurality of stacked base silicon monolayers defining a base semiconductor portion and at least one oxygen monolayer constrained within a crystal lattice of adjacent base silicon portions;
    wherein the oxygen monolayers are formed using $N_2O$ as an oxygen source.

13. The method of claim 12 wherein the base silicon monolayers are formed at a temperature in a range of 600° C. to 800° C.

14. The method of claim 13 wherein the base silicon monolayers are formed at a temperature in a range of 665° C. to 685° C.

15. The method of claim 12 wherein the oxygen monolayers are formed at a temperature in a range of 500° C. to 750° C.

16. The method of claim 12 wherein an exposure time for the oxygen source is between 1 and 240 seconds.

17. The method of claim 12 wherein the oxygen source comprises a helium source gas with less than 2% $N_2O$.

18. The method of claim 12 wherein the STI regions are formed prior to forming the spaced apart structures.

19. The method of claim 12 further comprising forming a respective cap semiconductor layer on each of the spaced apart structures.

20. The method of claim 12 wherein forming the cap semiconductor layers comprises forming the cap semiconductor layers at a temperature in a range of 580° C. to 900° C.

21. A method for making a semiconductor device comprising:

forming a plurality of spaced apart structures on a semiconductor substrate within a semiconductor processing chamber, each structure comprising a plurality of stacked groups of layers, and each group of layers comprising a plurality of stacked base silicon monolayers defining a base semiconductor portion and at least one oxygen monolayer constrained within a crystal lattice of adjacent base silicon portions;

wherein the oxygen monolayers are formed using $N_2O$ as an oxygen source at a temperature in a range of 500° C. to 750° C., and wherein the base silicon monolayers are formed at a temperature in a range of 600° C. to 800° C.

22. The method of claim 21 wherein forming comprises forming the plurality of groups of spaced apart structures using epitaxial chemical vapor deposition (CVD).

23. The method of claim 21 wherein the base silicon monolayers are formed at a temperature in a range of 665° C. to 685° C.

24. The method of claim 21 wherein an exposure time for the oxygen source is between 1 and 240 seconds.

25. The method of claim 21 wherein the oxygen source comprises a helium source gas with less than 2% $N_2O$.

* * * * *